United States Patent [19]
Wandass et al.

[11] Patent Number: 5,103,174
[45] Date of Patent: Apr. 7, 1992

[54] MAGNETIC FIELD SENSOR AND DEVICE FOR DETERMINING THE MAGNETOSTRICTION OF A MATERIAL BASED ON A TUNNELING TIP DETECTOR AND METHODS OF USING SAME

[75] Inventors: Joseph H. Wandass, Mohegan Lake, N.Y.; Richard J. Colton; James S. Murday, both of Springfield, Va.

[73] Assignee: The United States of America as represented by the Secretary of the Navy, Washington, D.C.

[21] Appl. No.: 484,950

[22] Filed: Feb. 26, 1990

[51] Int. Cl.[5] .................. G01B 7/24; G01R 33/18; G01R 33/02; G01N 27/72
[52] U.S. Cl. ...................... 324/244; 324/209; 324/226; 324/260; 324/262
[58] Field of Search ............... 324/201, 209, 228, 226, 324/244, 260, 262, 227, 261

[56] References Cited

U.S. PATENT DOCUMENTS 4,861,990 8/1989 Coley .................... 324/201

Primary Examiner—Walter E. Snow
Attorney, Agent, or Firm—Thomas E. McDonnell; Barry A. Edelberg

[57] ABSTRACT

A tunneling tip piezo is incorporated into various devices for measuring the effect of changes in environmental conditions (i.e., temperature, pressure, magnetic and electrical fields, etc) upon a material by sensing minute changes in the dimensions of the surface. The devices may be used to detect changes in environmental conditions or to determine physical properties of a material.

15 Claims, 12 Drawing Sheets

TIME →

|— 10 sec. —|

TIME →

TIME ⟶

TIME →

*FIG. 13*
*FIG. 13i*
*FIG. 13ii*
*FIG. 13iii*

MAGNETIC FIELD SENSOR AND DEVICE FOR DETERMINING THE MAGNETOSTRICTION OF A MATERIAL BASED ON A TUNNELING TIP DETECTOR AND METHODS OF USING SAME

BACKGROUND OF THE INVENTION

1. Field of the Invention

This invention relates generally to a tunneling-tip based sensor, and especially to a sensor for detecting changes in the physical properties of materials subjected to various environments.

2. Description of the Prior Art

Sensors may be used to detect conditions in the environment or to determine the effect of these conditions on a particular material. For example, sensors are currently used to detect, inter alia, acoustic fields, electrical fields, magnetic fields and temperature, as well as the effects of changes in these conditions upon the physical characteristics of various materials. Generally, a compact sensor having high sensitivity is preferred.

Presently, the most sensitive instruments for measuring weak magnetic fields are the superconducting quantum interference devices (SQUIDs) which are capable of detecting fields as small as $10^{-11}$ to $10^{-12}$ gauss. SQUIDs, however, must be operated at cryogenic temperatures which may limit their general utility.

Fiber optic magnetic sensors can also measure small magnetic fields. Two basic approaches for magnetic field detection with a fiber optic sensor exist: Faraday rotation and the magnetostrictive jacket or stretcher approach. In the former method, paramagnetic impurities in the fiber optic material cause a rotation of the polarization plane of light transmitted through the fiber; this change in polarization is used to detect magnetic field changes. In the latter method, which is much more sensitive, a magnetostrictive coating is applied around the fiber. Changes in the length of the fiber upon exposure to magnetic fields cause interference effects in the light being propagated through the fiber optic material. Sensitivities of about $(10^{-5})$ to $(10^{-8})$ gauss have been measured with a fiber length of one meter.

Resonance magnetometers, especially the optically pumped alkali vapor magnetometers, also have sensitivities approaching $(10^{-10})$ gauss. In addition, there are many other types of magnetometers based on magnetic induction. These include the vibrating and rotating sample magnetometers, the vibrating coil magnetometer, and the well known fluxgate magnetometer. These magnetometers generally have sensitivities less than or equal to $10^{-6}$ gauss. The fluxgate magnetometer deserves special mention because it is one of the oldest methods and perhaps most used due to its reliability, relative simplicity, stability, economy, and ruggedness.

The more sophisticated devices that have high sensitivity such as the SQUID and the resonance magnetometers have some operational shortcomings. For example, the SQUID magnetometer must be operated at cryogenic (or liquid helium) temperatures. Liquid helium is expensive and has a limited lifetime (hours) before the dewar needs to be refilled. The optically pumped alkali vapor resonance magnetometers can be quite large and require a laser system to operate them. The development of a compact, sensitive, room temperature magnetic field detector would be advantageous to the magnetic field sensing community.

SUMMARY OF THE INVENTION

Accordingly, an object of this invention is to provide a detector of changes in physical properties of materials exposed to variations in environmental conditions.

And, an object of the present invention is to provide a position-sensitive detector which operates at room temperature.

Another object of the present invention is to provide a position-sensitive detector that has a relatively small size.

Also, an object of this invention is to provide a position-sensitive detector employing a scanning tunneling tip.

Further, an object of this invention is to provide a position-sensitive detector which is simple in design and construction.

Additionally, an object of this invention is to provide a position-sensitive detector which ha low power consumption.

Specifically, an object of this invention is to provide a position-sensitive detector which is inexpensive to operate.

These and other objects are accomplished by the present invention. In the present invention, the ability of a scanning tunneling microscope to detect variations in the tip-to-surface distance, for the first time, is advantageously used to detect a change in the physical properties of material subjected to environmental changes, such as the magnitude of a weak magnetic field. The present invention achieves this result by coupling the variation in the environmental condition to the STM via a change in the physical dimensions of a material having a dimension which varies in correspondence to that change or having a dimension whose variation with respect to that of the environmental condition is to be measured. The present invention is particularly useful for the detection of magnetic field of low strength.

BRIEF DESCRIPTION OF THE DRAWINGS

A more complete appreciation of the invention and many of the attendant advantages thereof will be readily understood by reference to the following detailed description when considered in connection with the accompanying drawings in which like numerals in different figures represent the same structures or elements wherein:

FIG. 7a shows the results for a graphite tip used in the normal scan mode, FIG. 7b shows the results for a tungsten tip used in the normal scan mode, and FIG. 7c shows the results for a tungsten tip used with heterodyne detection.

FIG. 13 is a plot of the solenoid input signal used in Example 2.

FIGS. 13i–13iii are plots of sensor response for the applied magnetic fields of several amplitudes.

DESCRIPTION OF THE PREFERRED EMBODIMENTS

One example of the present invention is a scanning tunneling device capable of measuring minute dimensional changes in a strip, i.e., a ribbon or wire, of magnetostrictive material. (In the present specification, the terms strip, ribbon and wire are used interchangeably unless used in reference to a specific example or unless comparatively discussed). The Scanning Tunneling Microscope (STM) is an example of a position sensitive detector capable of distinguishing the structure or position of atoms on a surface. In STM, electrons can tunnel through the potential barrier established when two electrodes, in this case a sharp tip and a conducting or semiconducting surface, come within less than a nanometer of each other while based. The atomic sensitivity of STM results from the exponential dependence of the tunneling current on tip-surface separation. Rastering the tip in the plane of the specimen while keeping the tip-to-surface distance constant (or, in other works, maintaining a constant tunneling current) using a piezoelectric manipulator traces out, in effect, the topography of the surface with a vertical resolution of about 0.01 nm and a lateral resolution of about 0.2–0.3 nm.

Magnetostrictive behavior is a known phenomenon in which a material will change its length in the presence of a magnetic field. Materials having significant magnetostriction are well known, and the effect of alloy structure and composition on magnetostrictive behavior have been previously reported. Indeed, efforts have been made to produce materials of reduced magnetostriction, since this property can be bothersome in applications requiring close tolerances in the presence of a magnetic field.

The tunneling tips are made from a conductive or semiconductive material, such as tungsten wire, gold wire or graphite pencil lead. The tips are sharped by using appropriate electrochemical etching techniques for the metal wires or by mechanical methods. The tip is attached to a tube piezoelectric scanner which acts as the fine approach mechanism. A fine screw, micrometer or lever make up the coarse mechanism that positions the tip with respect to the opposing end of the magnetostrictive ribbon.

The magnetostrictive ribbon is mounted in a manner which fixes the non-tunneling end with respect to the tunneling tip, but otherwise permits free elongation along its longitudinal axis. For example, the ribbon may be fixed at its far end and otherwise held on or sandwiched between one or two low surface friction plates, or the far end may be fixed and longitudinal edges of the ribbon can be supported within a tube having inner surfaces with suitably low sliding resistance. For example, the tube may be quartz, glass or have an inner surface composed of a low friction polymer or other low friction material. Of course, the entire tube could be constructed from a low friction polymer, such as polytetrafluoroethylene. The ribbon may also be supported or floated on a liquid placed in the tube.

Figure 1:
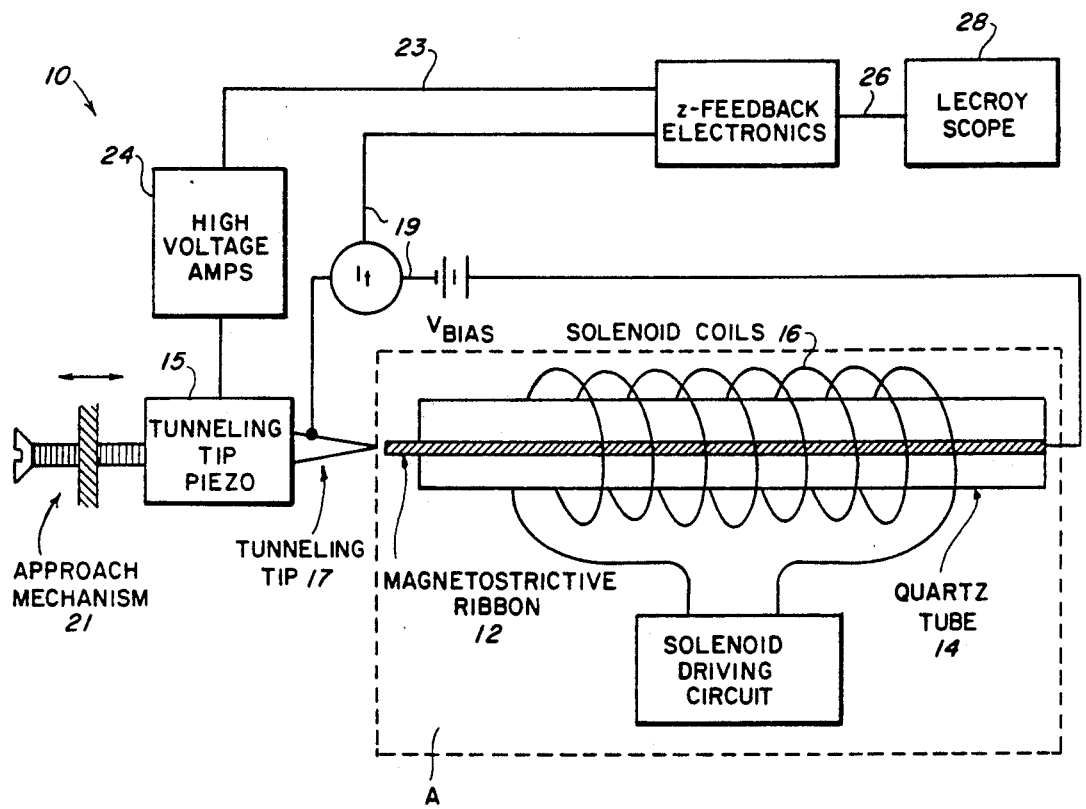
FIG. 1 is a schematic illustration of a first embodiment of a magnetometer according to the present invention.
Figure 1A:
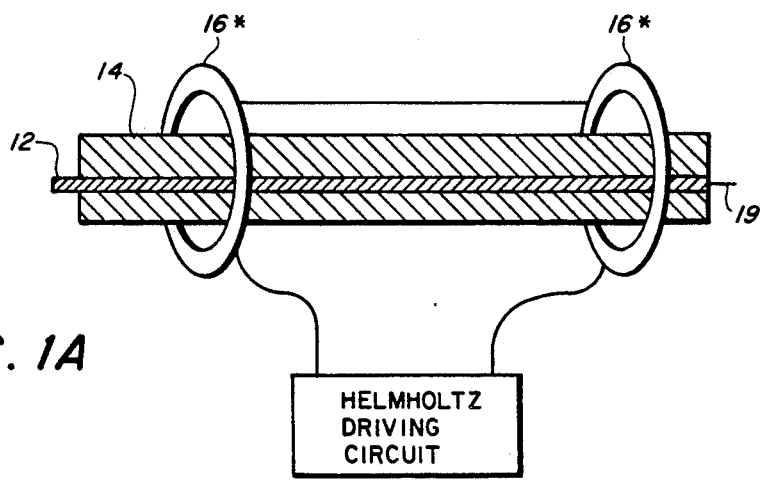
FIG. 1A shows a variation of section "A" of the FIG. 1 embodiment where the solenoid coil and driving circuit are replaced by Helmholtz coils and a Helmholtz driving circuit. The drawing is not to scale.

FIG. 1 schematically illustrates a preferred embodiment of a system 10 according to the present invention. Tube 14, made of quartz or other similar material, supports a ribbon 12 of magnetostrictive material so that the curved sides of the tube support the ribbon vertically but permit the ribbon to move freely along the horizontal axis. Tube 14 is surrounded by solenoid coil 16, or better, a Helmholtz coil 16* in FIG. 1A which brings the apparatus into the maximum range of the ribbon's magnetic sensitivity.

Figure 2:
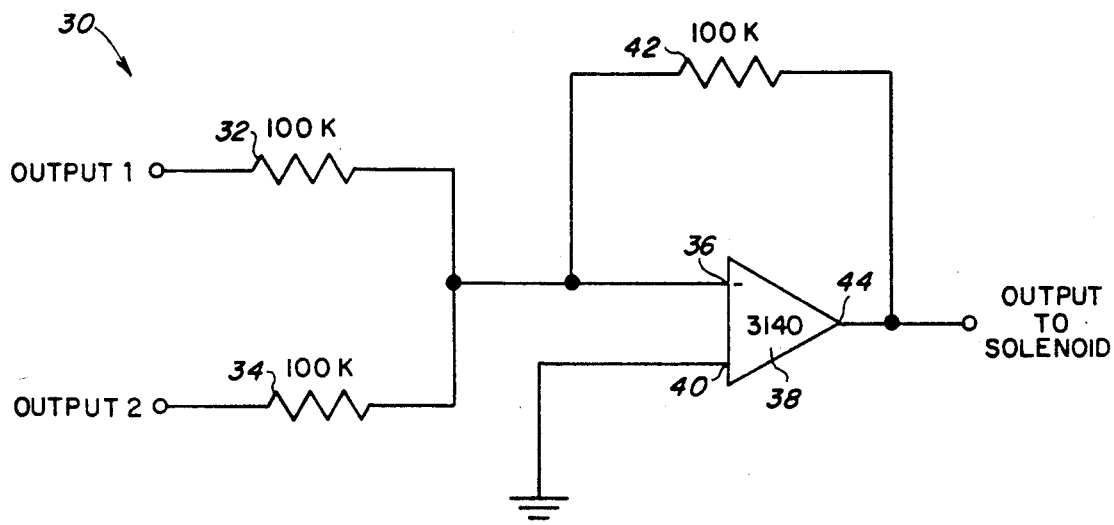
FIG. 2 is a circuit diagram of a solenoid driving circuit useful in the magnetometer of the present invention.

FIG. 2 is a circuit diagram which shows the circuit 30 used for driving the solenoid coils used in Example 1. That circuit includes two input resistors, 32 and 34, feeding into one channel the inverting input 36 of an operational amplifier 38. The noninverting input 40 is connected to ground. The operational amplifier 38 is used in the negative feedback mode. Of course, other circuits may be used to drive the solenoid.

Figure 3:
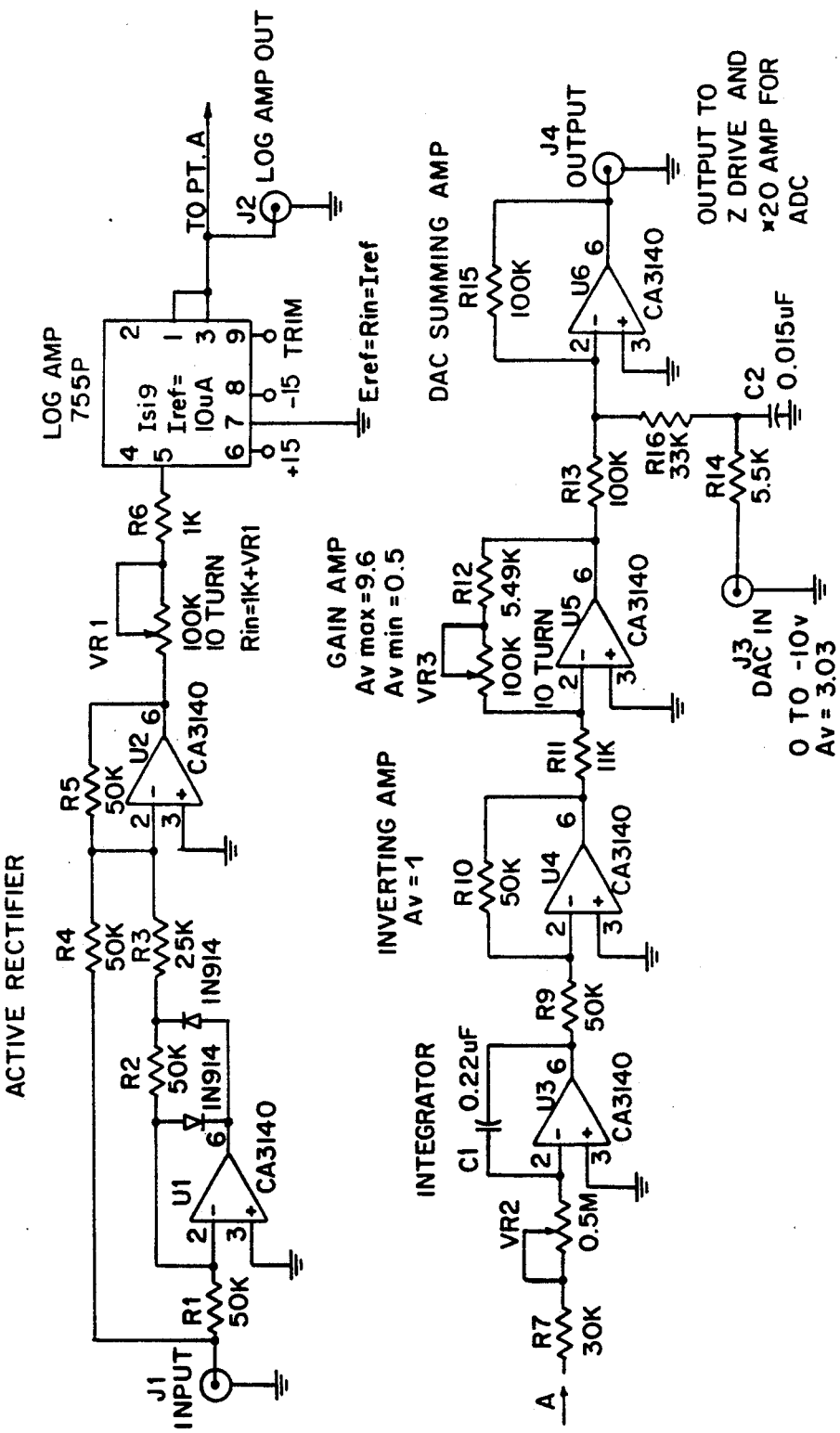
FIG. 3 is a circuit diagram of z-feedback circuitry useful in the magnetometer of the present invention.

Tunneling tip 17 is ridgedly attached to tip piezo 15 and is biased with respect to ribbon 12 by biasing circuitry 19. An approach mechanism 20 positions the tunneling tip 17 sufficiently close to the near end of ribbon 12 that a tunneling current develops between the ribbon and the tip. The circuitry 19 includes z-feedback electronics 21 which sense minute changes in the tunneling current. (An exempitive z-feedback circuit, used in the devices constructed in accordance with the accompanying examples, is shown in FIG. 3). Based upon these changes, the feedback electronics emit a corrective signal 23. This corrective signal is amplified by high voltage amplifier 24, which feeds the amplified signal to the piezo 15. The resulting variation in the piezo tube voltage extends or retracts the tip a distance sufficient to maintain an essentially constant tunneling current.

A signal 26 having the same magnitude as the corrective signal 23 is also feed to a LeCroy scope 28, which monitors the magnitude of signal 26. The magnitude of signal 26, as recorded from scope 28, thus indicates the change in distance between tip 17 and the adjacent end of ribbon 12, i.e. the magnetostrictive response of ribbon 12. This magnetostrictive response is directly proportional to the strength of the magnetic field generated by coil 16.

Figure 4:
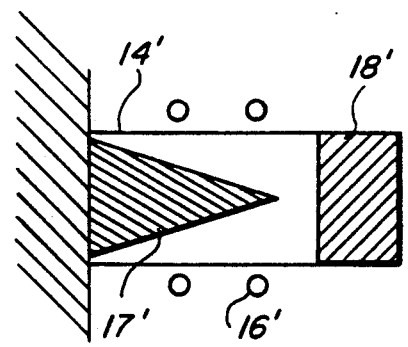
FIG. 4 is a schematic illustration of a third embodiment according to the present invention.

FIG. 4 shows another embodiment of the present invention. In FIG. 4, tunneling tip 17' is made of a magnetostrictive material. Solenoid coil 16' surrounds quartz tube 14' about the periphery of tip 17'. Tip 17' is maintained close to and biased with respect to a smooth surface 18' so that a tunneling current is established therebetween. The coarse position of the smooth surface is adjusted with a fine screw or micrometer. In this arrangement, a piezo becomes unnecessary.

In the present invention, improved sensitivity is obtained by using the most magnetostrictive material practical. In practice, a magnetostrictive material useful in the present invention will exhibit a magnetostriction (d1/1, where 1 is length) of at least about $10^{-5}$ at that length. The most important criteria in this regard is that the total change in ribbon length which occurs at the weakest magnetic field desired to be measured must be sufficient to alter the tip-to-surface distance by at least an amount which changes the tunneling current to a detectable degree (i.e., using current scanning tip technology, this corresponds to displacements of at least about 0.1Å and perhaps as small as $10^{-4}$. Improvements unrelated to the present invention may lower the smallest detectable distance. That improved technology will not significantly alter the present invention, and the use of the present invention with that improved technology is contemplated by and considered as within the present teaching).

Regardless of the use to which the present invention is being applied, the strip of material whose dimensional changes are being measured is preferably a wire rather than a ribbon. A wire is far less likely to twist than is a ribbon. Further, where the environmental changes are coupled to the scanning tunneling tip device via the magnetostrictive properties of the material, the use of a small diameter wire (about 1 to 5 μm) rather than a ribbon significantly reduces demagnetization problems.

Magnetostrictive behavior is exhibited by a wide variety of ferromagnetic materials, including ferromagnetic elements, especially iron, cobalt and nickel, as well as ferromagnetic alloys. The most noticeable magnetostrictive behavior, however, arises in amorphous magnetic materials, such as metallic glass. Metallic glasses, such as those described in Koon et al U.S. Pat. No. 4,533,408, incorporated herein by reference, may be useful, provided that they have the required magnetostriction. In general, since elemental iron has a relatively large magnetostriction, iron-rich amorphous alloys will also be magnetostrictive. Cobalt is also strongly magnetostrictive, but in a direction opposite to that of iron. Therefor, in compositions containing both iron and cobalt, for the composition to have magnetostrictive properties useful in the present invention, the amounts of each must be such that the magnetostrictive effects of iron and cobalt do not cancel. To avoid this cancellation, an iron and cobalt-containing amorphous glass alloy for use in the present invention should contain a large excess of iron. One magnetostrictive material preferred for use in the present invention is available commercially under the tradename of Metglas TM, such as Metglas TM 2605SC, which has the composition $Fe_{81}B_{13.5}Si_{3.5}C_2$. The Metglas TM compositions preferred for use in the present invention have been annealed at 390° C. for 10 minutes in a >1 kOe magnetic field parallel to the ribbon width. This annealing produces a transverse, or so-called "striped" domain pattern. When exposed to a magnetic field in the longitudinal direction, the magnetic moments rotate, converting magnetic energy into elastic energy, resulting in an elongation of the ribbon. A full 90° rotation of the moments (i.e., saturation) occurs at a field strength of 1 Oe (±15%) in the Metglas# preferred in the present invention.

The fractional length change of the ribbon can be written in terms of the angle of rotation of the magnetic moments:

$$\epsilon = \Delta 1/1 = (3\lambda_s/2)\cos^2\theta \tag{1}$$

where $\theta$ is defined to be the angle between the applied field and the total magnetic moment of the ribbon, and $\lambda_s$ is defined to be ⅔ of the fractional length change of the ribbon at saturation. For the Metglas TM ribbon preferred in the present invention, $\lambda_s$ equals $2.7 \times 10^{-5}$. Additionally, the fractional length change or strain, $\epsilon$, of the ribbon can be written in terms of the applied field:

$$\epsilon = (3_s/2)(M/2K)^2 H^2 \quad 0 < H < 1 \text{ Oe} \tag{2}$$

$$\epsilon = \text{constant} \quad H > 1 \text{ Oe (saturation)}$$

Here, M is the ribbon magnetization, H is the applied field and K is the anisotropy constant. Hence, the ribbon elongation is proportional to the square of the applied field, up to near saturation.

The response of the ribbon, or the fractional length change per change in field is:

$$d\epsilon/dH = 3\lambda_s(M/2K)^2 H \quad 0 < H < 1 \text{ Oe} \tag{3}$$

$$= 0 \quad H > 1 \text{ Oe (saturation)}$$

Figure 12A:
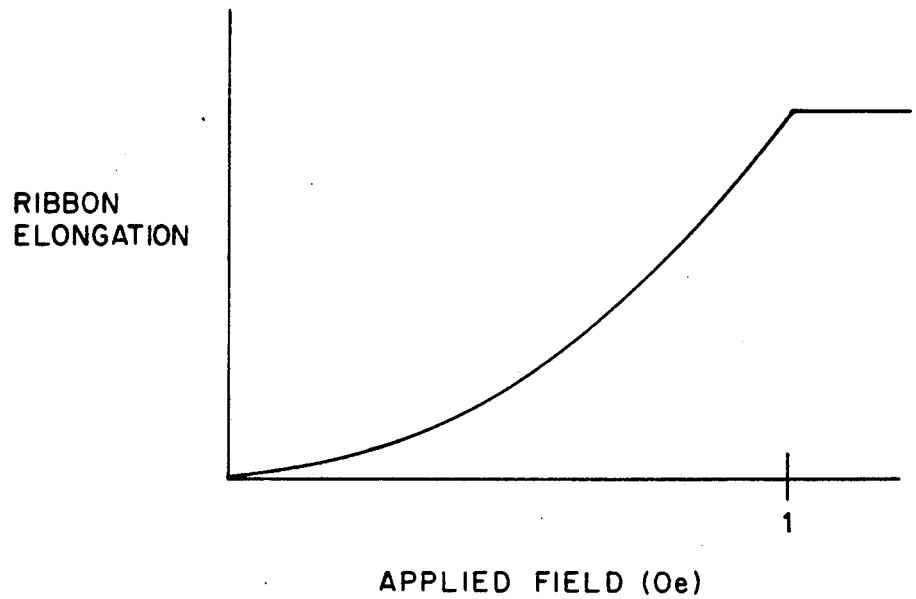
FIG. 12a is a schematic diagram of ribbon elongation vs. applied field for Example 2.

Thus, the greatest response will occur at a field strength just below 1 Oe. The dependencies of the ribbon elongation and response on the applied field are depicted schematically in FIGS. 12a and 12b.

The biasing voltage applied is not critical, although in practice, a biasing voltage of 20 mV to 3 V is typical. In general, the control of and stabilization of the tunneling tip apparatus may be accomplished by those means previously used in STM. Techniques for optimizing control and stabilization of prior art STM devices should be equally applicable to the present invention.

When a piezo tube is used, the tunneling tip should be a highly conductive material, such as electrochemically etched gold or tungsten wire in accordance with standard practice in STM. The piezo tube is also conventional for standard STM, and is usually piezoelectric ceramic. As is standard practice for STM, the tip and the ribbon are brought to within about one nanometer of each other. Ideally, once electron tunneling to clean metal surfaces has been established by biasing the ribbon and tip with respect to each other, the tunneling current will change by an order of magnitude for a 0.1 nm separation. As explained above, this change will be reflected by a change in the piezo driving voltage.

The tunneling tip has been shown to detect displacements as small as $10^{-4}$ nanometers. For magnetic field detection, a tunneling tip is used to monitor dimensional changes of materials which undergo magnetoelastic deformation or magnetostriction. Magnetostrictive behavior is exhibited by a variety of materials such as the ferromagnetic elements, their alloys, and amorphous magnetic materials such as metallic glasses which change their length upon being subjected to a magnetic field, or if under stress change their magnetization and length. Because the displacements to be measured are very small, the tunneling tip detector is inherently small in size, is inexpensive to build and operate, and requires low power to operate.

Figure 4A:
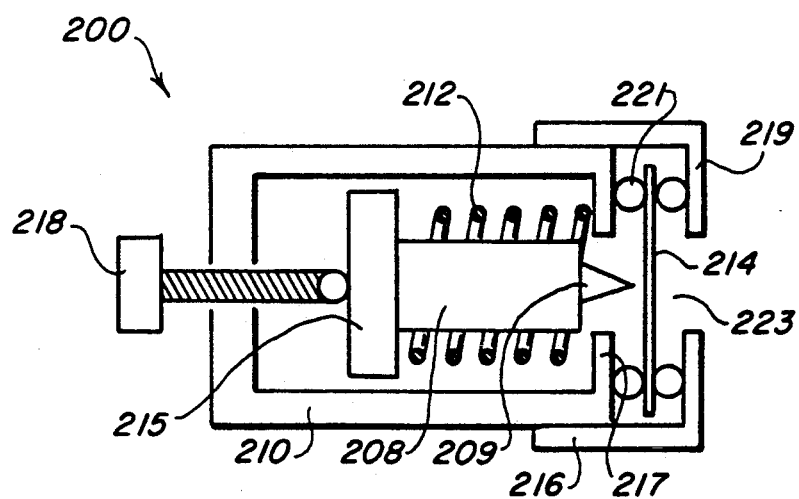
FIG. 4A is a schematic cross-section of a device according to the present invention for detecting minute sound intensities.

The present invention also permits the construction of a ultra-sensitive microphone or nanophone consisting of a thin diaphragm to pickup sound and a tunneling tip detector to measure the displacement of the diaphragm. FIG. 4A shows a schematic cross-sectional diagram of the nanophone 200. The device is constructed analogously to that used for magnetic sensing. The tunneling tip piezo 208 is mounted within tube 210 so that the tunneling tip 209 is sufficiently close to conducting or semiconducting diaphragm 214. The tunneling tip 209 is offset from diaphragm 214 by a spring 212, extending between flange or base 217 on tube 210 and flange or shoulder 215 on tunneling tip piezo 208. Screw adjuster 218 accomplishes the coarse adjustment of the tip to diaphragm distance. Diaphragm 214 is mounted tauntly within end cover 219 by fitting between o-rings or gaskets 221. End cap 219 slids or screws on top of tube 210. Opening 223 in end cap 219 is placed facing the oncoming sound waves or expected source of sound. Except for opening 223, the device 200 acoustically insulates the tip and diaphragm to reduce interference from background noises.

The nanophone illustrated in that FIG. 4A is about two inches in length and one-inch in diameter. However, the nanophone could eventually be microfabricated to reduce its size significantly.

Because the mechanical constants dictate the frequency range over which displacement is directly proportional to the incident sound pressure, the frequency response measurement can determine the mechanical properties of the diaphragm itself. Therefore, a nanophone according to the present invention may be used to measure the mechanical and acoustical properties, including photoacoustic response, of materials.

A nanophone according to the present invention may also be used to measure the elastic modulus of thin metallic films, metallic and semiconducting superlattices, and polymer films.

With metallic or conducting films the tunneling tip will tunnel directly to the diaphragm, but for insulating films such as polymers, the tunneling tip will detect the displacement of a small lever arm in contact with the thin polymer film.

Although it has been possible to study the nanomechanical properties of thin films with the bulge tester and nanoindentation instruments, the nanophone should make the test much simpler, because the probing source is simply a sound wave. In addition, once the properties of the thin films themselves are known, it may be possible to measure directly the change in mechanical properties of the film when the surface is modified by the deposition of a thin coating even at the monolayer level.

Further, if the piezo-side of the nanophone (see FIG. 4A) is made air-tight, such that a constant pressure can be maintained, the nanophone will become a very sensitive pressure gauge or barometer capable of measuring minute changes in pressure across the diaphragm. Finally, if the pressure on the piezo-side of the diaphragm is adjusted so as to deform the diaphragm, the elastic properties of deformed materials can be studied.

The acoustical properties of different films or media can be measured by depositing thin or thick films onto the diaphragm of the nanophone or by placing the nanophone in different media. The vibrational frequency is affected by the loading of the diaphragm by contact with another media, or by the loading of the diaphragm by a small additional mass. From the measurement of the characteristic impedances, the sound reflection and transmission coefficients may be calculated as a function of film thickness.

The opto-acoustic or photoacoustic effect with solids is well known. Here, a chopped light impinging on a solid sample in an enclosed cell produces an acoustic signal within the cell. The primary source of the acoustic signal arises from the periodic heat flow from the solid to the surrounding gas, as the solid is cyclically heated by the absorption of the chopped light. One application, photoacoustic spectroscopy, has become an analytical tool for obtaining the electromagnetic absorption spectra of both opaque and highly transparent materials.

The invention having been generally described, the following examples are given as particular embodiments of the invention and to demonstrate the practice and advantages thereof. It is understood that the examples are given by way of illustration and are not intended to limit the specification or the claims to follow in any manner.

EXAMPLES

EXAMPLE 1

Figure 5:
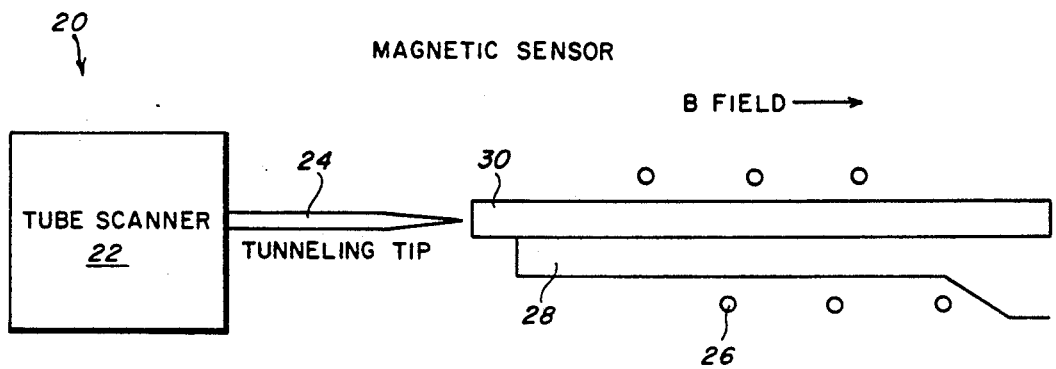
FIG. 5 is a schematic illustration of a second embodiment according to the present invention.

The experimental set-up for the tunneling tip-based magnetometer is shown in FIG. 5. The STM 20 used in these experiments was purchased from the Tunneling Microscope Company. This unit consists of parallel elastomer damped metal plates (not shown) supporting the specimen positioning and scanner apparatus. A manually operated lever/spring deformation system (not shown) was used for tip to specimen movement, and a 7x optical loupe (not shown) was used for specimen approach. The unit incorporates a tube scanner 22 described by Binnig et al, in Rev. Sci. Instrum. 57, 1688 (1986), incorporated herein by reference, which has an approximate axial mode resonant frequency of 40 kHz and a response of approximately 5 nm/V in each direction. The driving electronics for the STM were built in-house. The bias voltage applied to the scanning tip 24 was typically $-100$ mV with respect to the sample, which is at a virtual ground potential. The tunneling current was set at 10 nA. Data collection was by means of an X-Y chart recorder, and no data processing was used other than the application of an RC low-pass filter for noise filtering. A Faraday cage (not shown) that covers the STM was used for both electromagnetic shielding and to attenuate potentially disruptive air currents. A transistor current source (now shown) was used for driving the magnetic field solenoid 26.

Tungsten tunneling tips were made using the so-called "AC self-termination" method (described by W. W. Muller in "Advances in Electronics and Electron Physics", Vol. 13, Academic Press (1960) p. 83, incorporated herein by reference) which involves etching a piece of tungsten wire (0.25 mm diameter, Alfa Products) electrochemically in a 2M aqueous NaOH solution using about 6 VAC. Tip radii were estimated at several hundred nanometers. Graphite tips were made from 0.7 mm commercial pencil leads and were roughened by grinding the end against abrasive paper. Gold STM tips were made by DC etching gold wire in a solution of 50% HCl, 25% ethanol, and 25% glycerine. The gold wire was held at a potential of +7 VDC, and the etching was stopped before the gold was completely parted. The wire was then removed and rinsed with ethanol. Immediately prior to use, the end of the gold tip was broken off with a pair of forceps, exposing a fresh surface at the tip.

Strips of smooth amorphous Metglas TM alloy 2605S-2 ($Fe_{78}B_{13}Si_9$) or Metglas TM alloy 2605SC ($Fe_{81}B_{13.5}Si_{3.5}C_2$), were obtained from the Allied Signal Corporation. Prior to use, the ribbons (initially 10 cm long, 3 mm wide and 0.025 mm thick) were annealed in a transverse magnetic field (>1 kOe) for 10 minutes at $T_1=415°$ C. for the 2605S-2 ribbons or at $T_1=390°$ C. for the 2605SC ribbon. Ribbons annealed in this way have been previously reported by others as having very high longitudinal magnetomechanical coupling factors. Before mounting in the STM, they were cleaned with reagent grade methanol and cut to a length of 13 mm. Unfortunately, cutting the ribbons this short causes them to be less sensitive than expected, due to the demagnetization effect. As the dimensional ration (i.e., long axis/short axis) of the ribbon becomes small (i.e., less than 4000:1), the demagnetizing field created by the specimen itself can become appreciable such that the field acting on the middle of the ribbon is the result of the applied and demagnetizing field.

Some of the older Metglas TM 2605S-2 ribbons displayed obvious surface corrosion which affecting tunneling. In order to tunnel to these ribbons, some were coated with colloidal graphite in water suspension. This procedure was not possible for all of the ribbons due to the different wetting characteristics of the ribbon surfaces. For ribbons that were not wettable with the colloidal graphite suspensions, gold foil was fitted to the end of the ribbon and crimped with tweezers. For the 2605SC ribbon, gold was sputter deposited on the end of the ribbon that faced the STM tip, and the gold coating extended several millimeters back from the end.

The mount 28 for the ribbon 30 was made from Teflon and was approximately 2 cm in length (see FIG. 5). It was made to fit in place of the normal STM specimen holder. The magnetostrictive ribbon was attached at one end with Ag paint, while the other end overhung the edge of the specimen mount by about 2 mm. A three-turn circular solenoidal coil 26, 0.75 cm long and 1.0 cm in diameter, was wound coaxially with the ribbon; the power leads (not shown) were vibrationally decoupled by using 32 gauge Cu wire and damped with rubber before attachment to the current source. DC magnetic field elongation of the ribbon 30 showed a sensitivity between 1 and 23 nm/gauss. Factors which influenced these values included the type of material used, ribbon length and age, and most importantly the extent of demagnetization which depends on the ribbon dimensions. A response of the sensor to AC magnetic fields was observed down to 0.02 gauss at a frequency of 1 Hz. The calculated sensitivity of the sensor was near $10^{-6}$.

Initial experiments involved using magnetostrictive ribbons as received with only a methanol rinse, even though some showed visible corrosion. The STM tunneling current using a tungsten tip was erratic and the tip frequently drifted out of range. In addition, attempts to obtain topographic images of the flat portion of the ribbon surfaces were unsuccessful. Exposing the ribbon to DC magnetic fields up to a maximum of 1.3 gauss produced no systematic change in the erratic tunneling current. These observations are consistent with the presence of an insulating oxide film which prevents tunneling unless, of course, the oxide is either very thin or the tip is in contact with the sample and actually poking into or through the oxide film. If the tip is in actual contact with the sample, the ribbon would then be effectively pinned at both ends causing it to behave differently than expected in an applied magnetic field.

Figure 6:
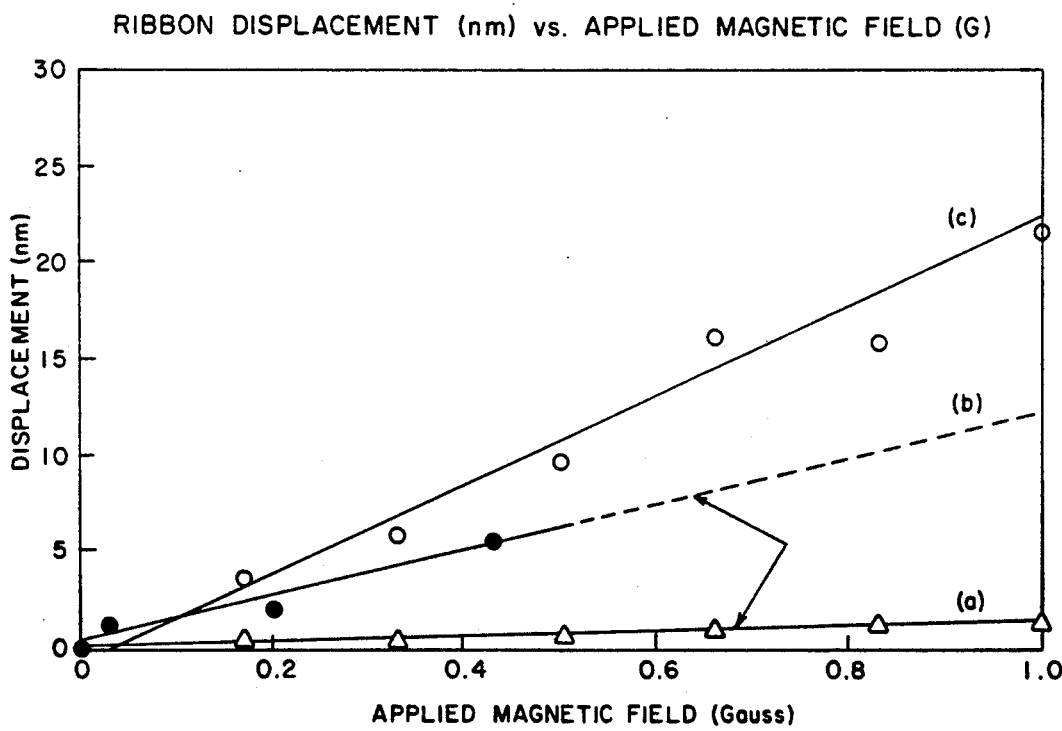
FIG. 6 is a graph of ribbon displacement vs. applied magnetic field in the magnetometer of Example 1. The graph shows displacement vs. field in gauss for (a) a graphite-coated 2605S-2 ribbon using a graphite tip; (b) a gold capped 2605S-2 ribbon using a gold tunneling tip; and (c) a gold sputter coated 2605SC ribbon with a gold tunneling tip.

In order to improve the stability of the tunneling current, the free end of some of the 2605S-2 ribbons were coated with colloidal graphite and the tungsten tip was coated with graphite or replaced with a graphite tip made from pencil lead. (Colton et al, in Appl. Phy. Lett. 51, 305 (1987), incorporated herein by reference, have demonstrated that graphite or graphite-coated tips may actually be in contact with the surface when imaging graphite in air by STM and that the physical contact actual provides higher rigidity and electrical stability to the tunnel junction, leading to more stable tunneling currents). Other 2605S-2 ribbons were fitted with a gold cap while 2605SC ribbons were coated with sputter deposited gold (as described above). FIG. 6 plots the displacement of the ribbon (relative to the voltage applied to the z piezoelectric driver controlling the position of the tip) versus the applied magnetic field for a graphite-coated 2605S-2 ribbon using a graphite tip; b) a gold capped 2605S-2 ribbon using a gold STM tip; and c) a gold sputter coated 2605SC ribbon with a gold STM tip. The magnetic field at the center of the coil can be estimated by the classical expression $$B_{center} = u_o i_o n \tag{4}$$

where $u_o$ is the permeability of free space ($4\pi \times 10^{-7}$ Weber/ampmeter), $i_o$ is the current in the solenoid, and n is the number of turns per unit length of the coil. This expression is for an ideal solenoid and only approximates the magnetic field for the 3-turn coils used in Example 1. Actual measurement of the magnetic field in our solenoid coil indicated that it was about 2.5 times lower than calculated, with a value of 0.003 gauss/mA of applied current.

In FIG. 6, the data show the elongation of the ribbon as a function of the applied magnetic field. The ribbons were mounted on the STM such that their long axes were aligned in an east-west direction with respect to the earth in order to reduce the effects of the earth's magnetic field (which is around 0.5 gauss or approximately half the magnetic saturation level of the ribbons). As mentioned above, however, the demagnetizing field is so strong in these short ribbons as to effectively reduce the applied field strength. As a result, the applied field used in this experiment does not begin to approach the magnetic saturation level for the ribbon.

Reversing the direction of the applied magnetic field did not change the results. The data for curve b were determined by using the values from AC measurements as described below while the other data were collected directly. The slopes of the least squares fit of the data were 1.3 nm/gauss for curve a (average of 6 runs), 12 nm/gauss for curve b (from the AC measurements), and 23 nm/gauss for curve c (average of 9 runs). The calculated value for a 0.75 cm long ribbon (the "effective" length of the ribbon exposed to the magnetic field produced by the solenoid out of the total ribbon length of 1.3 cm) with a $\lambda_s = 3 \times 10^{-5}$ at one Oersted is about 200 nm/gauss. The reason for the lower measured sensitivity is the problem of demagnetization of the ribbon, which becomes a critical factor as the length of the ribbon is decreased. For an "effective" $\lambda_s = "10^{-6}$, the sensitivity would be around 10 nm/gauss. The 2605SC ribbon seems to give a higher sensitivity than the 2605S-2 ribbon. From the measured slope of curve c, the sensitivity of the device is estimated to be $4 \times 10^{-4}$ gauss assuming that the STM has a displacement accuracy of 0.01 nm. However, this prototype device displayed a noise level equivalent to approximately 1 nm during the course of the experiments. Thus, the estimated sensitivity of the prototype device would be two orders of magnitude lower or about $4 \times 10^{-2}$ gauss. Increasing the stability of the device and increasing the length or decreasing the thickness of the ribbon are key factors in improving the sensitivity.

The noise level as well as the reproducibility of the measurement can be improved by using paraffin oil to hold down the ribbon to the surface of the teflon mount with surface tension. The effect is attributed to increasing the vibrational stability of the device. The stability of the device to vibration and effects of thermal drift can also be improved by rastering the tip over a $4 \times 4$ nm area at frequencies up to 5 kHz. The stability of the device to vibration may also be improved by intentionally vibrating the ribbon as is done with vibrating sample magnetometers (see S. Foner, IEEE Trans. Magn. MAG-17, 3358 (1981) and Gorden et al, IEEE Trans. Magn. MAG-8, 48 (1972), both of which are incorporated herein by reference). This procedure should also reduce the effect of forces acting on the ribbon due to the inhomogeneous field of the 3-turn solenoid. In addition, if an AFM or cantilever detection system is employed, and the ribbon is modulated at the resonant frequency of the system, as described by Binnig et al in Appl. Phys. Lett 40, 178 (1982) (incorporated herein by reference), smaller ribbon displacements and thus weaker magnetic fields should be measured.

Figure 7A:
FIGS. 7a–7c illustrate the relationship of the tunneling signal to the type of tip (W or graphite) and operating mode by graphing Z piezo voltage vs. time.
Figure 7B:
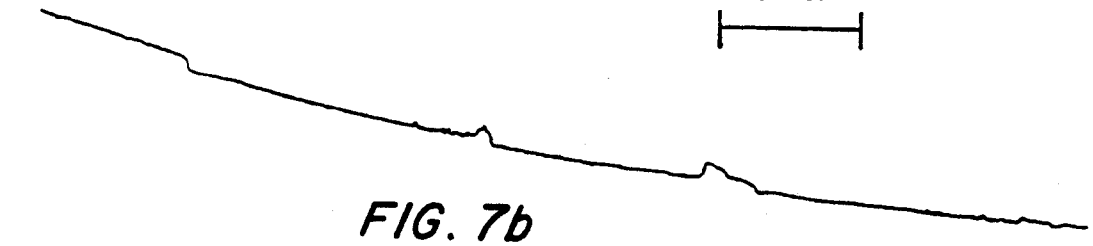

The noise level of the tunneling current also appeared to be dependent on the nature of the tip. FIGS. 7a and 7b compare the case for graphite and tungsten tips by plotting the voltage on the z piezo (that controls the position of the tip) as a function of time. The tunneling current was held constant at 10 nA by the feedback control circuit. The position of the graphite tip (FIG. 7a) was generally constant but with an obvious high frequency (1 kHz) noise component. The position of the tungsten tip (FIG. 7b), on the other hand, varied considerably and had less noise. The stability of the position of the graphite tip can be attributed to tip-specimen contact, which increases the vibrational stability of the tunnel junction in the graphite-graphite system. Without this presumably large area contact, the system using the tungsten tip will be more susceptible to vibration and thermal drift.

Figure 8A:
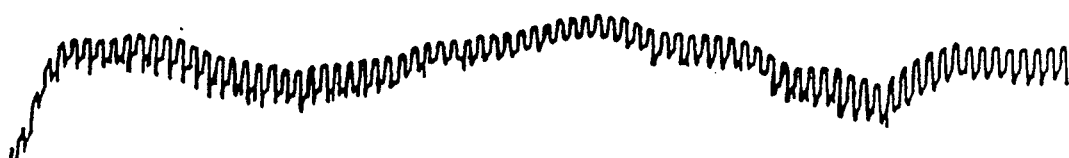
FIGS. 8a–8c illustrate the response of the device of Example 1 to AC magnetic fields of 0.25 gauss, 0.10 gauss and 0.02 gauss, respectively.
Figure 8B:
Figure 8C:
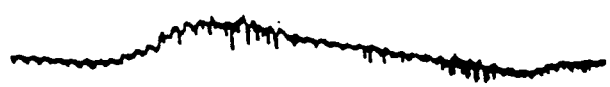
Figure 9A:
FIGS. 9a–9f illustrate the heterodyne effect in Example 1. Shown is the modulated Z piezo voltage versus time when the tunneling tip is rastered at 2.011 kHz in the X and Y directions. The magnetic field modulation frequencies used in FIGS. 9a–9f, respectively, are as follows: 2.021 kHz, 2.012 kHz, 2.011 kHz, 2.009 kHz, 2.001 kHz and 1.990 kHz.
Figure 9B:
Figure 9C:
Figure 9D:
Figure 9E:
Figure 9F:
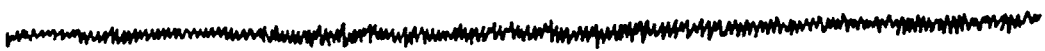
Figure 10A:
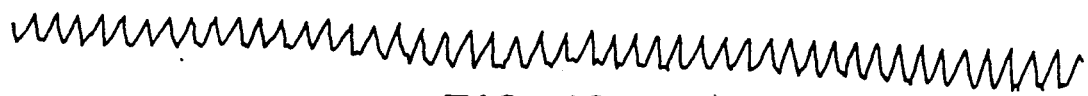
FIGS. 10a–10e show the response of the device of Example 1 to modulated magnetic fields using the heterodyne driving technique. A heterodyne frequency of about 4 Hz was used. Shown is the Z piezo voltage versus time. The magnetic field strengths (in gauss) in FIGS. 10a–10e, respectively, are as follows: 0.25, 0.10, 0.06, 0.04 and 0.02.
Figure 10B:
Figure 10C:
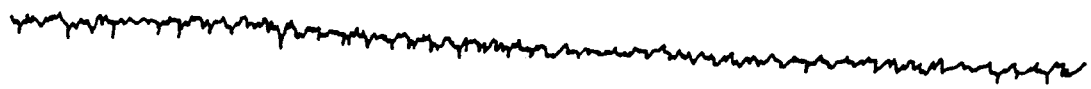
Figure 10D:
Figure 10E:

The ribbons were also exposed to various AC modulated magnetic fields using a signal generator to control the current source of the solenoid. A tungsten tip was used during these experiments, and the end of the ribbon was capped with gold foil. FIGS. 8a-8c show the response of the system to various 1 Hz current pulses corresponding to 0.25 gauss, 0.10 gauss, and 0.02 gauss. Although the signals are quite apparent for the higher fields, the 0.02 gauss signal is just visible above the noise level. In addition, large variations in the position of the tungsten tip (as discussed) above) represents, in effect, a DC background which must be reduced or stabilized in order to improve the detection limit of the device. Improvements in the mounting system of the ribbon, vibration and thermal isolation, and electrical noise shielding should improve the detection limits of the device.

An interesting and useful effect was discovered while the X and Y raster frequencies of the tip were being varied. As the raster frequencies approached the magnetic field modulation frequency (which was set at 2 kHz in this instance), the chart recorder pen began to oscillate in a regular sinusoidal manner. The frequency and amplitude of the oscillation depended on the absolute difference in frequency between the raster and magnetic field modulation frequencies. This mode of operation, referred to as the "heterodyne" technique, is shown in FIGS. 9a-9f, where the X and Y raster frequency was set at 2.011 kHz and the magnetic field modulation frequency was varied from 1.990 to 2.021 kHz with an amplitude of 0.25 gauss. Although it is not intended to be bound by theory, it is postulated that rastering the tip over the presumably rough surface causes a modulation in the tip-to-specimen separation giving rise to the heterodyne effect. Ideally, it would be best to modulate the position of the tip directly against a flat surface in order to remove effects caused by surface roughness.

Figure 7C:

The heterodyne effect observed here may, nevertheless, be applied to detect AC magnetic fields by examining the amplitude of the heterodyne peak. This is not the only benefit of using the heterodyne method however. An additional degree of stability is conferred to the tunneling system when a heterodyne signal is observed. This effect is depicted in FIG. 7c which shows the time domain behavior of the position of the tunneling tip in the heterodyne driven system. The heterodyne frequency was set at 6 Hz and the tip was tungsten. Comparing this to the previous data for the tungsten tip (FIG. 7b), one sees that the heterodyne modulated system is more stable than the non-heterodyne driven system. However, the level of higher frequency noise on the feedback signal is increased when the heterodyne technique is used. (The results of the heterodyne technique are qualitatively similar to the sensitivity improvements in AFM when the sample is modulated at the system resonant frequency).

The results of using the heterodyne technique for detecting AC magnetic fields are shown in FIGS. 10a-10e, which show the signal amplitudes resulting from pulsed magnetic fields of 0.02 gauss to 0.25 gauss applied to the ribbon. A heterodyne frequency of about 4 Hz was employed, and the tip was tungsten. The signal/noise ratio begins to fall off at about 0.06 gauss, and the larger background excursions (see FIGS. 8a-8c) have been eliminated. It is possible that the higher frequency noise (see above) which accompanies the use of the heterodyne technique may limit the observed sensitivity.

EXAMPLE 2

Unless stated otherwise, all methods, apparatus and conditions are as in Example 1. The tunneling-tip magnetometer depicted schematically in FIG. 1 was used. This device consists of four main parts: the Metglas TM ribbon, the tunneling tip and approach mechanism, the solenoid and its driving circuit, and the feedback electronics. The device operates in air and at room temperature. To provide vibration isolation, it rested on five stacked stainless steel plates separated by Tygon TM spacers which, in turn, were set on a marble table supported with air shocks. The device was enclosed in a Faraday cage to minimize electrical pickup, and a styrofoam box provided some thermal and acoustic isolation.

The Metglas TM ribbon was 10 cm long, 2.6 mm wide and 0.025 mm thick and rested horizontally in a 3 mm inside diameter, 9 cm long quartz tube. The curved sides of the tube supported the ribbon in the vertical direction but allowed it to slide freely in the horizontal direction. The quartz tube was supported at either end by Macor TM blocks. One end of the ribbon had a 90° bend of aluminum foil (about 5 mm total length) attached to it. The foil had an approximately 100 nm thick gold film sputter-deposited on it to provide the tunneling surface. The evaporated gold surface, together with the gold tunneling tip (described in the next paragraph) provided an especially quiet tunneling current. The tunneling current was measured from the opposite end of the ribbon, which was clamped between two Macor TM blocks.

The tunneling tip and approach assembly consisted of the tip itself, the piezoelectric tube ceramic (PZT-5A) and its mount, and the approach mechanism. The piezo was a 1.3 cm long×0.6 cm O.D. cylinder. One end was glued to a 2.5 cm×2.5 cm×0.3 cm thick Macor TM block. A small Macor TM cylinder containing a setscrew was glued inside the other end of the tube ceramic, to hold the tip. (The tips were made from 0.6 mm diameter gold wire by electrochemical etching in a 50% HCl, 25% ethanol, 25% glycerol solution). The Macor TM piezo mount travelled on four 2.2 mm diameter horizontal rods extending from one of the Macor TM quartz tube supports. The piezo mount was hold away from the quartz tube support by a ball-point pen spring on each of the stainless rods. The coarse approach was made with a ¼ inch-56 screw which drove the piezo mount and thus the tunneling tip, against the action of the springs, toward the end of the Metglas TM ribbon.

The detector's solenoid was 6.5 cm long, and 1.3 cm outside diameter. It was wound from 17 mil (including insulation) diameter aluminum wire to approximately 170 turns/cm. It was mounted coaxially with the quartz tube, between the two Macor TM supports. The coil was calibrated with a Bell Model 640 Gaussmeter and Model SAB4-1218 cylindrical probe: a current of 47 mA produced a field of 1 Oe at the center of the solenoid. In an actual application, the solenoid would be used only to provide a bias field in order to bring the detector to its region of maximum sensitivity. In this experiment, however, the solenoid was used to provide both the bias field and the "unknown" field. The solenoid driving circuit wa a standard operational amplifier summing circuit, shown in FIG. 2. This circuit adds a DC voltage applied at input 1 (providing the bias field) and a 1 Hz square wave applied at input 2 (providing the "unknown" field) produced by a Wavetek Model 20 Function Generator and a Kay Model 432D attenuator.

The feedback electronics circuit diagram is depicted in FIG. 3, which has been described in detail by DiLella, Wandass, Colton and Marrian, in Rev. Sci. Instr. 60, 987 (1989), incorporated herein by reference. Briefly, the function of the circuit was to keep the tunneling tip a constant distance above the surface (in this case, the aluminum foil attached to the end of the Metglas TM ribbon). This was accomplished by sensing changes in the tunneling current (such as those caused by elongation or contraction of the Metglas TM ribbon), and then regulating the piezo-tube voltage to extend or retract the tip in order to compensate for these changes.

The preamp electronics were mounted on the magnetometer proper. They consisted of an Analog Devices 544 current-to-voltage converter configured for a gain of $10^7$ V/A, and an Analog Devices 524 instrument amplifier set for a gain of 10. This gave a total preamp gain of $10^8$ V/A. The remainder of the feedback circuit was in a box separate from the magnetometer. An Analog Devices 755P logarithmic amplifier linearized the exponential dependence of the tunneling current on the tip-ribbon separation. The active rectifier preceding the log-amp provided the necessary negative input. The log-amp input resistor (VR1) was set at 9 K$\Omega$ to provide a tunneling current of 1 nA. Integrator U3 filtered the log-amp output. Typically, the resistor VR2 was set at 0.25 M$\Omega$. The integrator was followed in the circuit by an invertor, an amplifier set at unity-gain, and a summing amp which was not used in the present experiment.

The output of the feedback electronics was monitored on a LeCroy Model 9400 dual-trace, digital oscilloscope for the data collection, after passing through two consecutive 3 Hz low-pass RC filters. The (nonfiltered) output also drove a high-voltage Burr-Brown 3584 amplifier operated with supply voltages of ±150 volts. This amplifier drove the piezo-ceramic.

The nature of the tip and the acoustic environment of the STM have a profound effect on the stability and sensitivity of the device. The measured sensitivity of the sensor can be improved by increasing the vibrational stability of the sensor and by increasing the length or decreasing the thickness (diameter) of the magnetostrictive ribbon (wire) to reduce the demagnetization field. A fluid can be used to damp the vibration of the ribbon in order to improve the stability of the sensor. A coupling between the specimen and the tunneling tip caused by rastering or dithering the tip leads to a modulation of the tunneling current at the difference frequency of the two giving rise to a heterodyne method of detection. When driven in the heterodyne mode, the tunneling current is more stable than with a non-heterodyne system.

Figure 11:
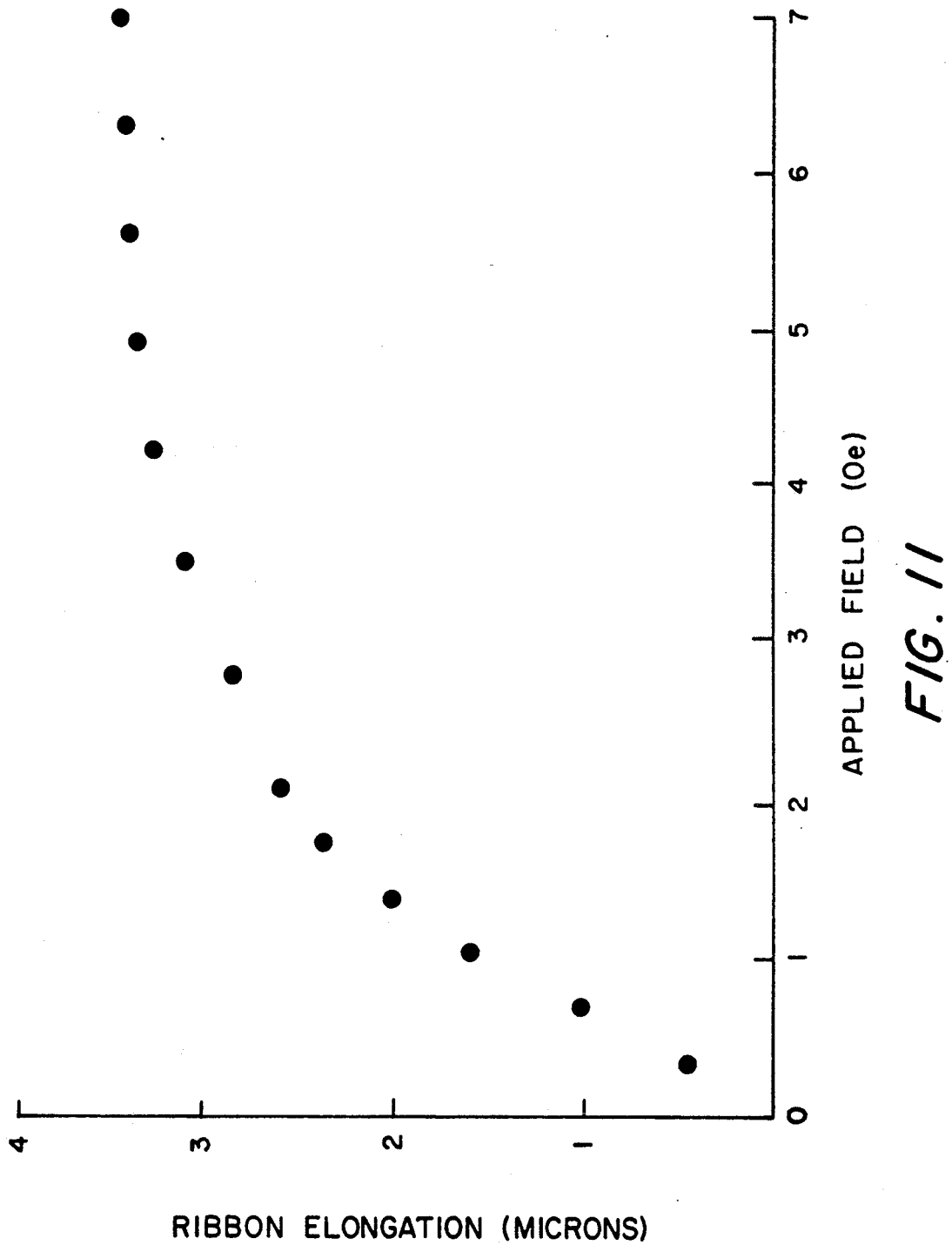
FIG. 11 is a graph of ribbon elongation (in microns) vs. applied field strength (in Oe) for the device of Example 2.

Several measurements were made in order to characterize the magnetic field sensor. These measurements were made using a tip bias of 100 mV and a tunneling current of 0.1 nA. These included elongation versus applied field, response and sensitivity measurements. The experimentally determined dependence of the Metglas TM ribbon elongation on the applied field is shown in FIG. 11. This data differs considerably from the theoretical curve depicted in FIG. 12a. FIG. 11 shows complete saturation has not been achieved below a field strength of approximately 5 Oe (as measured at the center of the solenoid). The reason for this is the nonuniformity of the field along the solenoid axis. The field was measured at the center of the coil; the field at the coil's edges will be smaller. Thus, the ends of the Metglas TM ribbon experience a smaller field than the center of the ribbon. Only when the entire length of the Metglas TM ribbon is exposed to a uniform magnetic field can the theoretical field dependence be obtained. This result can be accomplished by placing the ribbon at the center of a long solenoid (however, this would make the sensor unacceptably large) or by replacing the solenoid by a set of Helmholtz coils which surround the entire magnetometer. Besides the smaller size, another advantage of the present design is that the response of the device is nearly linear in the region of maximum sensitivity (see FIG. 11). One consequence of this is the sensor's response will not be seriously affected by its orientation with respect to the Earth's field.

Figure 12B:
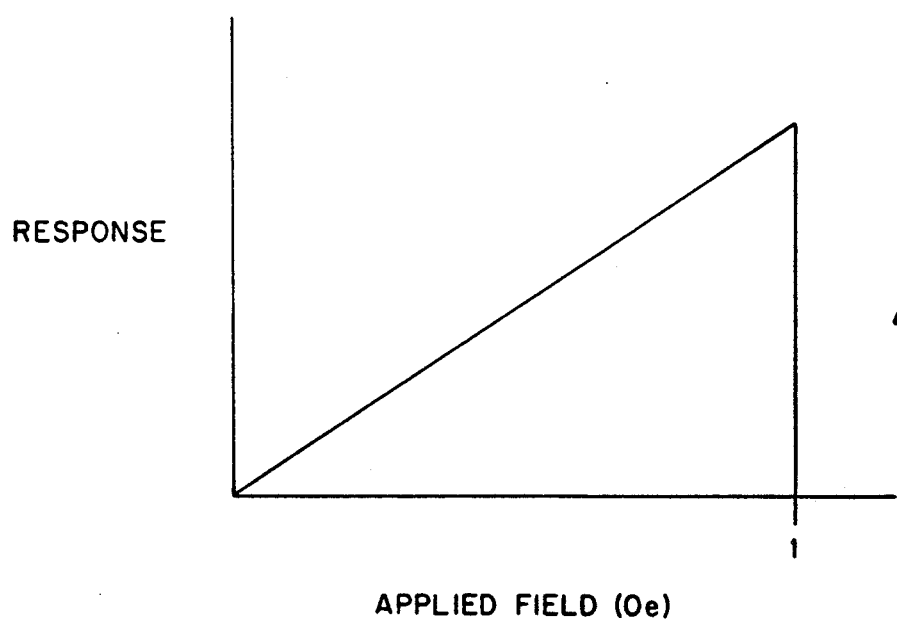
FIG. 12b is a schematic diagram of fractional ribbon length change per change in field vs. applied field for Example 2.

It can be seen from FIGS. 12l and 12b that the useful operating range for this detector in a uniform field extends up to 1 Oe, or the saturation point of the ribbon. (A way of increasing this range will be discussed below. The total ribbon elongation was measured as 3.5 microns. This value was compared with a value of 3.6 microns predicted by Eqn. 1 for a 9 cm ribbon (the remaining one cm was clamped). From Eqn. 3, the greatest response to small-field excursions around a DC value occurs at a field of just under 1 Oe. Using a 1 Hz square-wave field of amplitude 10 mOe superimposed on a DC field of 0.85 Oe, a signal response of 30±6 volts/Oe was observed. Variations of approximately 20% in the observed response are probably due to irregularities in the gold surface, tip and ribbon vibrations, or possibly to ribbon bending. The piezo tube ceramic used in this work had a response of 3.8 nm/volt, and the high-voltage amplifier had a gain of 15. Thus, the observed elongations produced ribbon responses of about 1.7 microns/Oe for small-field excursions around 0.85 Oe. This is approximately 19 ppm of ribbon length per Oe.

The sensitivity measurements were performed in the same way as the response measurements described above. A DC bias field of 0.85 Oe was superimposed on 1 Hz square-wave fields of various amplitudes. Given the above responses, the sensitivity of the instrument is limited by the signal-to-noise ratio. The noise level on the input to the high-voltage amplifier (where the measurements were made) was about 1 mV/$\sqrt{Hz}$, which is equal to 0.05 nm of ribbon elongation and corresponds to an applied field of 33 $\mu$Oe. The smallest change in field about the DC bias of 0.85 Oe actually resolved was 60 $\mu$Oe (with a 3 Hz band-limited signal). FIGS. 13-1-3iii show a plot of the solenoid input signal and the sensor response for fields of several amplitudes. Significantly, the minimum detectable field of 60 $\mu$Oe is a conservative figure, due to the nonuniformity of the "unknown" field in the sensitivity measurements. Subsequent experiments that replaced the solenoid coil with a uniform magnetic field generated by a set of Helmholtz coils improved the sensitivity of the device by a factor of two.

The design of the tunneling-tip magnetometer required tradeoffs between several competing factors: range, sensitivity, response and physical size. As built, the detector's range extended up to 1 Oe (in a uniform field), with a sensitivity of 60 $\mu$Oe. Using a DC bias field of 0.85 Oe, a measured ribbon response of 1.7 microns/Oe produced a signal response of 30 volts/Oe. The relationship between signal response and ribbon length may be generalized as 3 volts/(Oe-cm). A more sensitive detector could be built; however, the size of such a detector would increase with the sensitivity.

Specifically, by increasing the ribbon length, or combining the signals from an array of detectors, the response could be increased and, therefore, the sensitivity improved. Additionally, increasing the length of the solenoid, thus exposing the 9 cm active ribbon length to a uniform bias field, would increase the response by a factor of about 3.5. This effect is due to the greater slope of the curve in FIG. 12a at 0.85 Oe (assuming a total ribbon elongation of 3.5 $\mu$m) compared to the slope of the curve in FIG. 11 at 0.85 Oe.

The size of the detector could be reduced without increasing the demagnetizing field by decreasing the thickness of the ribbon, or by employing a small diameter wire, since the demagnetizing field within the ribbon or wire is related to its dimensional ratio (i.e., long axis/short axis). Another way of decreasing the size of the detector is to eliminate the solenoid altogether. If the sensor is to be used in an application where it is stationary, the Earth's field might provide a bias field that would produce sufficient sensitivity.

The sensitivity may also be increased by reducing the noise level in the signal. One way of reducing the noise level is to build a more rigid device. Another way is to modulate the tip bias at a high frequency, reducing the effects of 1/f noise at DC. Also, a heterodyne method might be employed, where the Metglas TM ribbon length is oscillated by an AC magnetic field and the tip is oscillated by modulating the tip bias voltage. The frequency of this signal could be tuned to the frequency of the field using a lock-in amplifier. The maximum field detectable by the sensor is limited by the Metglas TM ribbon saturation point. If a larger field range is needed, a shorter ribbon of the same width and thickness could be used, increasing the demagnetizing field in the ribbon. In this case, a larger external field would be needed to saturate the ribbon. For instance, Example 1 used a 1.3 cm ribbon which saturated at about 20 Oe. An advantage of this earlier configuration is that the physical size of the sensor is smaller than in Example 2. However, there is a sacrifice of a factor of 20 in the sensitivity of the smaller sensor.

The present invention, while described above largely with respect to magnetic field detection by use of magnetostrictive materials, can be applied to the determination of any environmental condition which changes the physical dimension of a material, such as the detection of electric fields by use of electrostrictive materials, temperature by use of materials with different thermal expansion coefficients, pressure and sound (also specifically described above) by use of a diaphragm and differential pressure, etc.

Obviously, numerous modifications and variations of the present invention are possible in light of the above teachings. It is therefore to be understood that within the scope of the appended claims, the invention may be practiced otherwise than as specifically described herein.

What is claimed is:

1. A device for measuring the strength of a magnetic field, comprising:

a surface;

a scanning tunneling tip in close proximity to, electrically biased with respect to, and opposite said surface;

adjustment means, attached to said tip or said surface, for maintaining the distance between said tip and said surface essentially constant;

a feedback means for maintaining an essentially constant tunneling current between said tip and said surface by maintaining said essentially constant distance between said tip and said surface, including a signal means for sending a feedback signal exponentially proportionate to the distance between said tip and said surface to said adjustment means; and said tip or said surface being one end of a magnetostrictive strip of material, the other end of said strip being fixed with respect to said respective opposite tip or surface, whereby, upon exposure of said strip to a magnetic field, said strip changes length, the distance between said tip and said surface changes, and said tunneling current thereby changes.

2. The device of claim 1, further comprising means for recording said feedback signal.

3. The device of claim 1, wherein said magnetostrictive material comprises a ferromagnetic metal element or alloy.

4. The device of claim 1, wherein said magnetostrictive material has a magnetostriction (dl/l) of about $10^{-9}$ to about $10^{-5}$ at a length of 10 cm.

5. The device of claim 3, wherein said magnetostrictive metal is a metallic glass.

6. The device of claim 4, wherein said magnetostrictive material is an alloy comprising, in order of molar prevalence, Fe, Co, Ni, B, Si and C.

7. The device of claim 1, wherein said scanning tunneling tip comprises graphite, tungsten, or gold.

8. The device of claim 1, wherein said scanning tunneling tip comprises a magnetostrictive material.

9. The device of claim 1, further comprising means for rastering said scanning tunneling tip over said surface.

10. A method for detecting the strength of a magnetic field, comprising the steps of:

electrically biasing a scanning tunneling tip and a surface with respect to each other, one of said tip and said surface comprising one end of a magnetostrictive strip;

maintaining said tip and said surface sufficiently close to each other to establish a tunneling current therebetween;

exposing said magnetostrictive material to a magnetic field, whereby said strip changes length, the distance between said tip and said surface changes, and said tunneling current thereby changes;

feeding said tunneling current into a feedback circuit which maintains a stable tunneling current by feeding an output signal for adjusting the distance between said tip and said surface by an amount needed to maintain an essentially constant tunneling current to a mechanism for adjusting the distance between said tip and said surface; and measuring the strength of said output signal.

11. The method of claim 10, wherein said magnetic field is modulated, further comprising rastering said tip over said surface at a modulation frequency near that of said magnetic field.

12. A method for measuring the magnetostriction of a material, comprising the steps of:

electrically biasing a scanning tunneling tip and a surface with respect to each other, one of said tip and said surface comprising one end of a strip of said material;

maintaining said tip and said surface sufficiently close to each other to establish a tunneling current therebetween;

exposing said strip of said material to a magnetic field of known strength, whereby said strip changes length, the distance between said tip and said surface changes, and said tunneling current thereby changes;

feeding said tunneling current into a feedback circuit which maintains a stable tunneling current by feeding an output signal for adjusting the distance between said tip and said surface by an amount needed to maintain an essentially constant tunneling current to a mechanism for adjusting the distance between said tip and said surface; and measuring the strength of said output signal.

13. The method of claim 12, wherein said magnetic field is applied by a solenoid coil or Helmholtz coils surrounding at least a portion of said strip.

14. A device for measuring the magnetostriction of a material, comprising:

a holding means for holding a sample strip of magnetostrictive material so that one end of the sample strip is free and the other end of the sample strip is fixed along the plane of the sample strip;

a scanning tunneling tip for positioning in close proximity to and opposite of the free end of the sample strip;

means for electrically biasing said tip with respect to the free end of the sample strip;

adjustment means, attached to said tip or said fixed end, for maintaining the distance between said tip and the free end of the sample strip essentially constant;

a feedback means for maintaining an essentially constant tunneling current between said tip and the free end of the sample strip by maintaining said essentially constant distance between said tip and the free end of the sample strip including a signal means for sending a feedback signal exponentially proportionate to the distance between said tip and the free end of the sample strip to said adjustment means;

magnetic field generating means for exposing at least a portion of the sample strip to a magnetic field, whereby the sample strip changes length, the distance between said tip and the free end of the sample strip changes, and said tunneling current thereby changes.

15. The device of claim 14, wherein said magnetic field generating means comprises a solenoid coil or Helmholtz coils for surrounding at least a portion of the sample strip.

* * * * *

UNITED STATES PATENT AND TRADEMARK OFFICE
CERTIFICATE OF CORRECTION

PATENT NO. : 5,103,174

DATED : April 7, 1992

INVENTOR(S) : Joseph Wandass, Richard J. Colton and James S. Murday

It is certified that error appears in the above-identified patent and that said Letters Patent is hereby corrected as shown below:

Title page, Item 75, line 3 after Springfield, Va.
add --; Robert A. Brizzolara of Alexandria, Va.--.

Signed and Sealed this

Nineteenth Day of October, 1993

*Attest:*

BRUCE LEHMAN

*Attesting Officer*     *Commissioner of Patents and Trademarks*